US006680833B2

(12) United States Patent  
Morishita (10) Patent No.: US 6,680,833 B2
(45) Date of Patent: Jan. 20, 2004

(54) INPUT-OUTPUT PROTECTION DEVICE FOR SEMICONDUCTOR INTEGRATED CIRCUIT

(75) Inventor: Yasuyuki Morishita, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 350 days.

(21) Appl. No.: 09/745,806

(22) Filed: Dec. 26, 2000

(65) Prior Publication Data

US 2001/0006243 A1 Jul. 5, 2001

(30) Foreign Application Priority Data

Dec. 27, 1999 (JP) .......................................... 11-371300

(51) Int. Cl.[7] .............................. H02H 9/00; H02H 3/22
(52) U.S. Cl. ......................... 361/56; 361/111; 257/360
(58) Field of Search .................. 361/56, 111; 257/355, 257/360, 356

(56) References Cited

U.S. PATENT DOCUMENTS

| | | | | |
|---|---|---|---|---|
| 5,682,047 A | * | 10/1997 | Consiglio et al. | 361/56 |
| 5,710,689 A | * | 1/1998 | Becerra et al. | 361/57 |
| 5,910,675 A | * | 6/1999 | Horiguchi et al. | 257/355 |
| 5,959,332 A | * | 9/1999 | Ravanelli et al. | 257/133 |
| 5,963,409 A | * | 10/1999 | Chang | 361/111 |
| 5,982,600 A | * | 11/1999 | Cheng | 361/111 |
| 5,991,134 A | * | 11/1999 | Tan et al. | 361/111 |

FOREIGN PATENT DOCUMENTS

| | | |
|---|---|---|
| JP | 10-70450 | 3/1998 |
| JP | 10-313110 | 11/1998 |
| JP | 11-135641 | 5/1999 |
| JP | 11-154732 | 6/1999 |

OTHER PUBLICATIONS

J.Z. Chen et al., "Design Methodology for Optimizing Gate Driven ESD Protection Circuits in Submicron CMOS Processes", EOS/ESD Symposium 97–230, pp. 3A.5.1–3A.5.10 with Abstract.

C. Richier et al., "Study of the ESD behavior of different clamp configurations in a 0.35 $\mu$m CMOS technology", EOS/ESD Symposium 97–240, pp. 3A.6.1–3A.6.6 with Abstract.

S. Ramaswamy et al., "EOS/ESD Reliability of Deep Sub–Micron NMOS Protection Devices", IEEE Transactions 1995, pp. 284–291 with Abstract.

* cited by examiner

*Primary Examiner*—Kim Huynh
(74) *Attorney, Agent, or Firm*—Sughrue Mion, PLLC

(57) ABSTRACT

An input-output ESD protection device is formed on a semiconductor substrate. A MOS protection device has a drain diffusion layer, a gate, a source diffusion layer, and a body, respectively. An input-output pad is connected to the drain diffusion layer. An internal circuit is connected to the gate. A control circuit is connected to the body. A first fixed voltage terminal is connected to the source diffusion layer. The body is electrically isolated from the semiconductor substrate.

13 Claims, 8 Drawing Sheets

INPUT-OUTPUT PROTECTION DEVICE FOR SEMICONDUCTOR INTEGRATED CIRCUIT

BACKGROUND OF THE INVENTION

This invention relates to an input-output protection device, and in particular, to an input-output protection device for protecting a circuit from electrostatic discharge (ESD).

Figure 1:
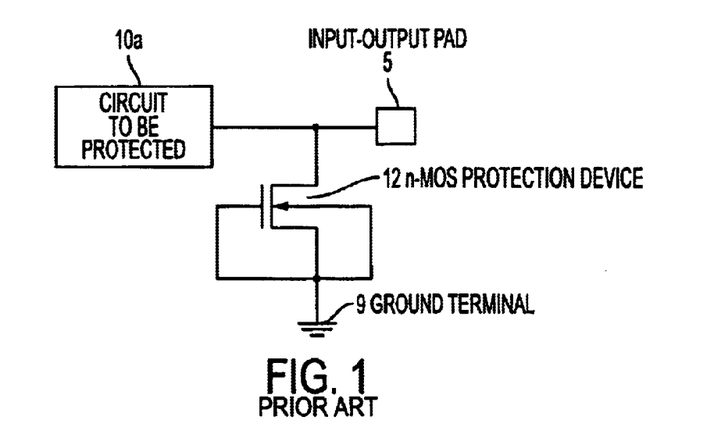
FIG. 1 is a circuit diagram showing the conventional input-output protection device of a semiconductor integrated circuit.
Figure 2:
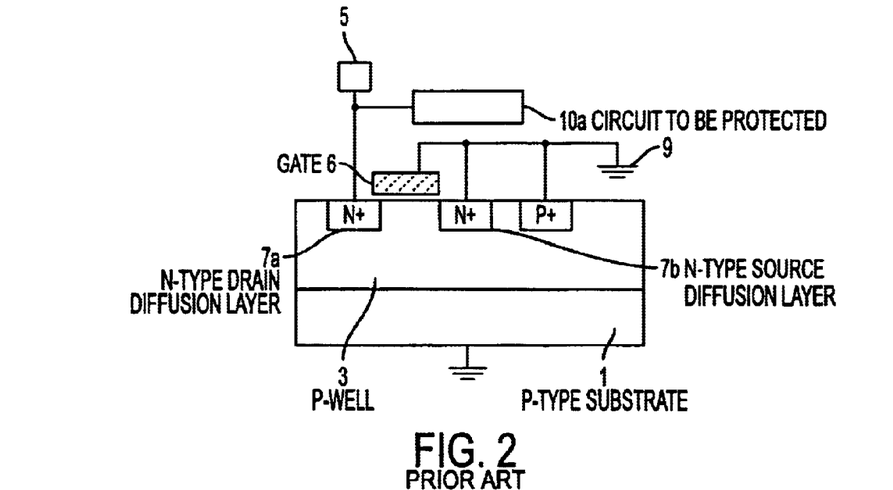
FIG. 2 is a cross sectional view showing the conventional input-output protection device of a conventional semiconductor integrated circuit.

Referring to FIG. 1 and FIG. 2, description will be made about a circuit of a most general nMOS protection device as the conventional input-output protection device.

In this example, when an ESD-voltage is stressed to an input-output pad 5, a nMOS protection device 12 is turned on, and an ESD-current flows into a ground terminal 9. In other words, the ESD-current is bypassed through the ground terminal 9. Thereby, a circuit 10a is protected.

When a negative polarity ESD-voltage is stressed to the input-output pad 5 for the ground terminal 9, a PN junction between an N-type drain diffusion layer 7a and a P-well 3 is put into a forward bias. Consequently, the ESD-current is bypassed through a forward PN diode.

Further, a sufficient ESD robustness is kept because a clamp voltage due to a forward diode is low, generally, 1V or less.

When a positive polarity ESD-voltage is stressed to the input-output pad 5 for the ground terminal 9, the PN junction between the N-type drain diffusion layer 7a and the P-well 3 is put into a reverse bias.

When a high reverse voltage is given to the PN junction, an avalanche breakdown phenomenon occurs in the PN junction. Thereby, a breakdown current flows from the N-type drain diffusion layer 7a into the P-type diffusion layer 8.

Because of the breakdown current the voltage-drop occurs at the P-well 3. As a result, the forward bias appears between the P-well 3 and the N-type source diffusion layer 7b.

Further, a parasitic NPN bipolar transistor, in which the N-type drain diffusion layer 7a, the P-well 3, and the N-type source diffusion layer 7b serve as a collector, a base, and an emitter, respectively, is turned on.

Figure 3:
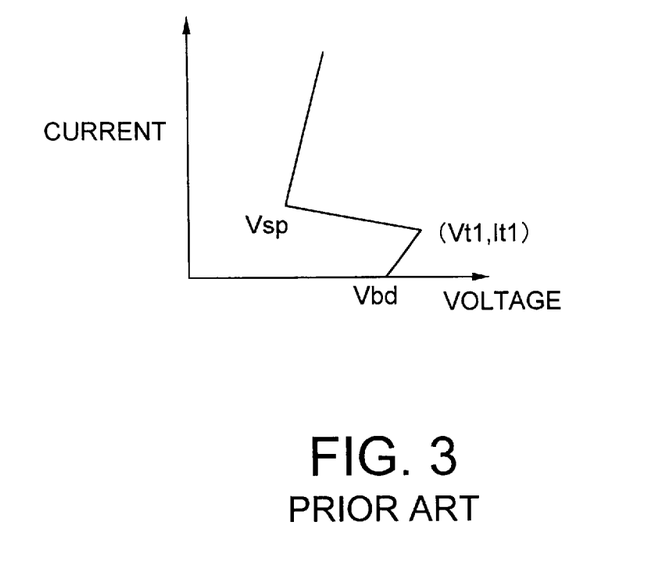
FIG. 3 is an electrical characteristic diagram showing the conventional input-output protection device of a conventional semiconductor integrated circuit.

Herein, a voltage-current characteristic in this state is illustrated in FIG. 3.

The breakdown phenomenon takes place at a voltage value Vbd. When the breakdown current reaches a current value It1, the parasitic NPN bipolar transistor is turned on, and the current flows on the condition that the voltage is held to Vsp.

Such a phenomenon is generally called a snapback. Further, Vt1 is referred to as a snapback trigger voltage while Vsp is referred to as a snapback holding voltage.

In a recent semiconductor integrated circuit, the device has been rapidly reduced in size because of high-density and high-speed.

Under this circumstance, ESD robustness is remarkably degraded because of thinner gate oxide, shallower drain junction and silicided diffusion.

In consequence, ESD protection device of high ESD robustness becomes more difficult.

To solve such a problem, it is necessary to lower the snapback trigger voltage. Several suggestions have been made about methods for raising up the gate potential of the nMOS protection device only when the ESD-current flows as the solving measures.

Figure 4:
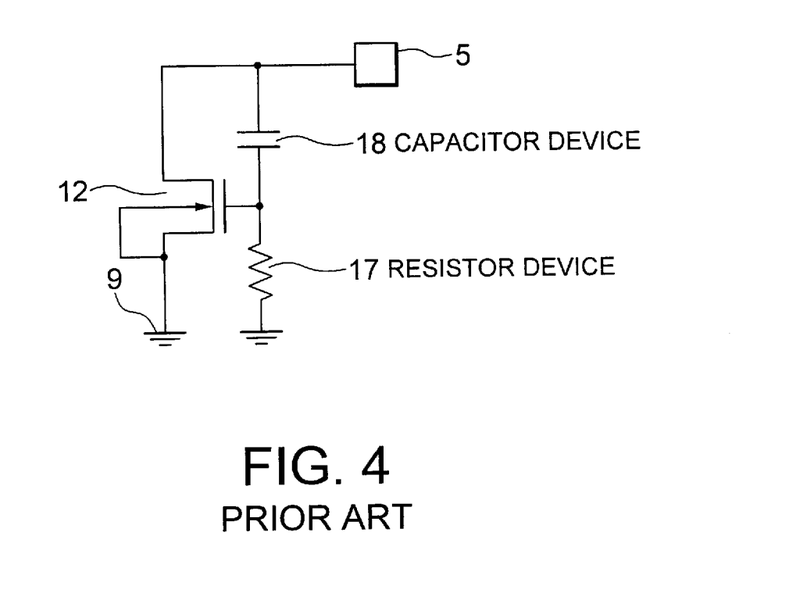
FIG. 4 is a circuit diagram showing the conventional input-output protection device of a semiconductor integrated circuit.
Figure 5:
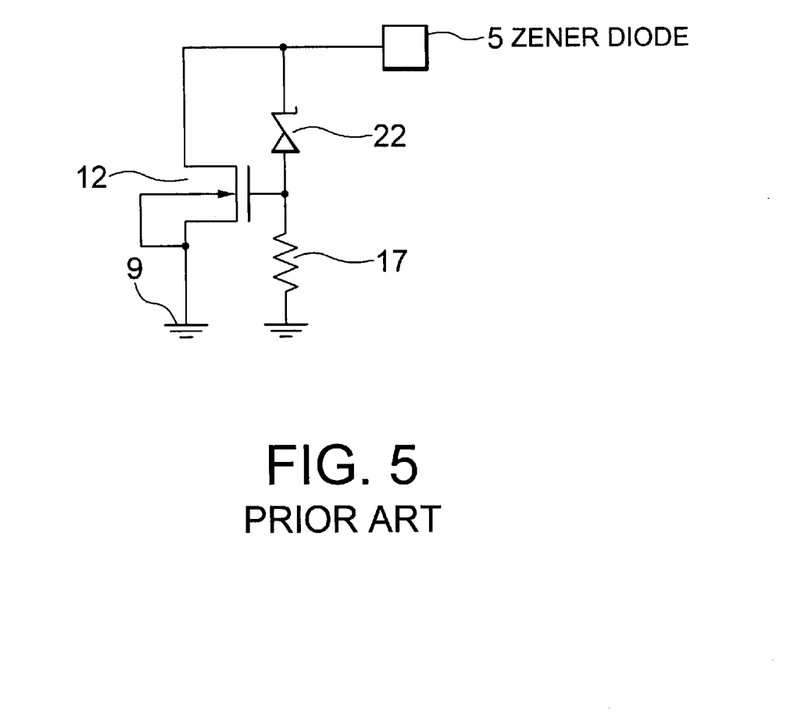
FIG. 5 is another conventional circuit diagram.
Figure 6:
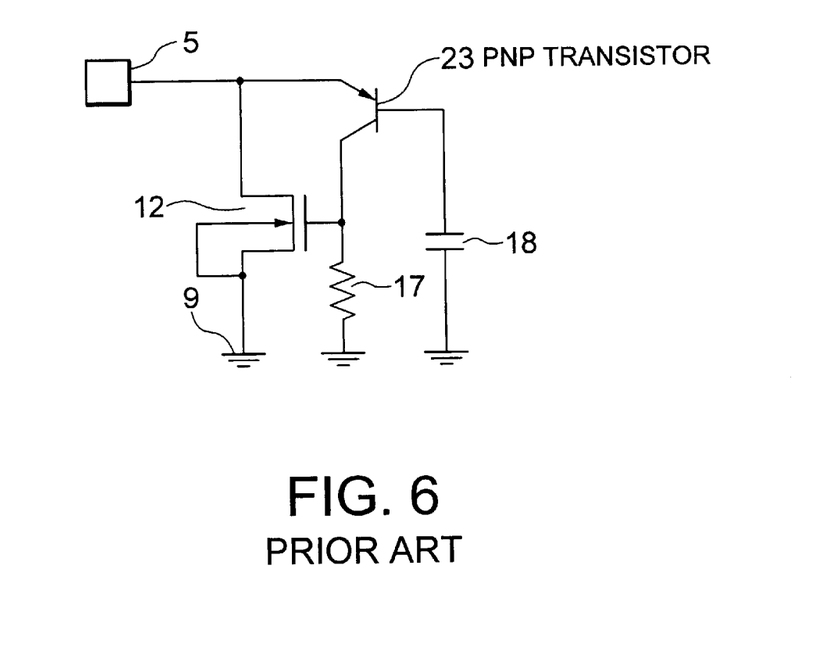
FIG. 6 is a still another conventional circuit diagram.

Referring to FIG. 4 through FIG. 6, description will be made about examples of circuits for solving the above-mentioned problems.

The circuit illustrated in FIG. 4 has been suggested by Sridhar Ramaswamy et. al., "EOS/ESD Reliability of Deep Sub-Micron NMOS Protection Devices," IEEE Transactions 1995, pages 284–291.

In this example, the input-output pad 5 and the gate of the nMOS protection device 12 are coupled via a capacitor device 18, and a resistor device 17 is connected between the gate of the nMOS protection device 12 and the ground terminal 9.

With such a structure, when the positive polarity ESD-voltage is stressed to the input-output pad 5 for the ground terminal 9, the gate voltage of the nMOS protection device 12 raises up transiently by a capacitor coupling effect.

A timing, at which the gate voltage raises up, is adjusted in dependence upon the values of the capacitor device 18 and the resistor device 17, and is selected such that the nMOS protection device is put into an off state when the integrated circuit is normally operated.

When the gate voltage of the nMOS protection device raises up due to transient ESD-current, an impact-ionization effect becomes high at a drain edge portion. As a result, the current, which flows from the N-type drain into the P-well, is increased, and the snapback trigger voltage is reduced.

When the snapback trigger voltage is reduced, the nMOS protection device can turn on at a lower voltage. Thereby, the ESD robustness can be improved.

In an example illustrated in FIG. 5, the gate voltage of the nMOS protection device raises up by utilizing a zener diode 22.

While, in an example illustrated in FIG. 6, the gate voltage rise up by the use of a PNP transistor 23 and a capacitor device 18.

Herein, it is noted that the both examples have been disclosed in EOS/ESD Symposium Proceedings, 1997.

As mentioned above, it is applied the gate voltage rise up effect due to transient ESD-current in order to improve ESD robustness.

Although the gate voltage of the MOS transistor raises up when the ESD-voltage is given thereto as mentioned described, the MOS protection device is put into the off state during the normal operation. Consequently, a signal of an internal circuit can not be given to the gate of the MOS protection device.

Accordingly, although the conventional ESD protection circuit is applicable as an only input protection device, but an output transistor, which drives by connecting the internal circuit to the gate, can not be applied as the protection device.

In consequence, an output-driving transistor is required in addition to the protection device with respect to an output pin of the integrated circuit. This inevitably causes to enlarge an output buffer in size.

In particular, all of I/O buffers must be enlarged in size in the integrated circuit, such as, a gate array that exchanges an input buffer and an output buffer by changing only a wiring layout using the buffer having the same structure, As a result, a chip size can not be reduced.

SUMMARY OF THE INVENTION

It is therefore an object of this invention to provide an input-output protection device, which is improved of ESD robustness degradation due to thinner gate oxide, shallower drain junction and silicided diffusion of an integrated circuit.

It is another object of this invention to provide an input-output protection device, which is applicable as any one of an input buffer, an output buffer, and a input/output buffer of an integrated circuit.

According to this invention, an input-output protection device is formed on a semiconductor substrate.

A MOS protection device has a drain diffusion layer, a gate, a source diffusion layer, and a body, respectively.

An input-output pad is connected to the drain diffusion layer. The gate connected to an internal circuit or ground terminal (power supply terminal).

A control circuit is connected to the body. Ground terminal (Power supply terminal) is connected to the source diffusion layer.

With such a structure, the body is electrically isolated from the semiconductor substrate.

In this case, the control circuit is connected to the body via a diffusion layer.

For example, the semiconductor substrate has a first conductive type, and the body is structured by a first well having the first conductive type.

In this condition, the body is electrically isolated from the semiconductor substrate via a second well having a second conductive type. Herein, the second conductive type is opposite to the first conductive type and a second well is formed between the first well and the semiconductor substrate.

Further, the second well may be coupled to the ground terminal (power supply terminal).

In this event, the first conductive type may be a P-type while the second conductive type may be an N-type.

Alternatively, the semiconductor substrate has a first conductive type, and the body is structured by a well having a first conductive type.

With this structure, the body is electrically isolated from the semiconductor substrate via an insulator. Herein, the insulator is formed between the well and the semiconductor substrate.

In this event, the first conductive type may be a P-type while the insulator may be an SOI layer.

Further, the control circuit may be an inverter having an input terminal and an output terminal.

In this case, the input terminal is connected to a power supply terminal (ground terminal), and the output terminal is connected to the body. Herein, the output terminal is connected to the body via a diffusion layer.

Alternatively, the control circuit may be composed of a capacitor device and a resistor device.

In this condition, the capacitor device is connected between the input-output pad and the body, and the resistor device is connected between the body and ground terminal (power supply terminal).

Instead, the control circuit may be composed of an inverter, a capacitor device and a resistor device, the inverter having an input terminal and an output terminal.

With such a structure, the resistor device is connected between power supply terminal (ground terminal) and the input terminal while the capacitor device is connected between the input terminal and ground terminal (power supply terminal). Further, the output terminal is connected to the body.

Under this circumstance, the control circuit serves to lower a snapback trigger voltage by rising up voltage of the body when a positive ESD-voltage is stressed to the input-output pad.

More specifically, the input-output protection device according to this invention includes the MOS structure, which composed of the drain, the gate, the source and the body.

With this structure, the drain is connected to the input-output pad, the source is connected to ground terminal (power supply terminal), as mentioned above.

Further, the body is electrically isolated from the semiconductor substrate, and is connected to the control circuit.

When the integrated circuit is normally operated, the control circuit fixes the voltage of the body.

For example, the inverter is used as the control circuit. In this event, the input terminal of the inverter is connected to power supply terminal (ground terminal) while the output terminal of the inverter is connected to the body.

When the ESD-voltage is stressed to the input-output pad for ground terminal (power supply terminal), the voltage of the body corresponding to the base of the parasitic bipolar transistor is not fixed. Consequently, the potential of the body easily raises up.

As a result, the snapback trigger voltage is lowered, and the protection device can turn on at the lower voltage. Thereby, the ESD robustness is improved.

Alternatively, the control circuit is structured by combining the capacitor device with the resistor device. With such a structure, the voltage of the body rises up by utilizing the capacitance coupling effect only when the ESD-voltage is stressed thereto.

Consequently, the snapback trigger voltage can be further lowered, and the ESD robustness can be improved also.

In the input-output protection device according to this invention, the body voltage of the protection device readily raises up. Thereby, the snapback trigger voltage is lowered.

Further ESD robustness does not depend upon the connecting method of the gate. In consequence, the protection device is applicable as the input buffer, the output buffer and the input/output buffer only by changing the layout of the gate connecting wiring pattern.

For example, when the protection device is applied for the input buffer, the gate is connected to the ground terminal (power supply terminal).

In the meantime, when the protection device is applied for the output buffer, the gate is connected to the output terminal of the internal circuit.

DESCRIPTION OF PREFERRED EMBODIMENTS

Figure 7:
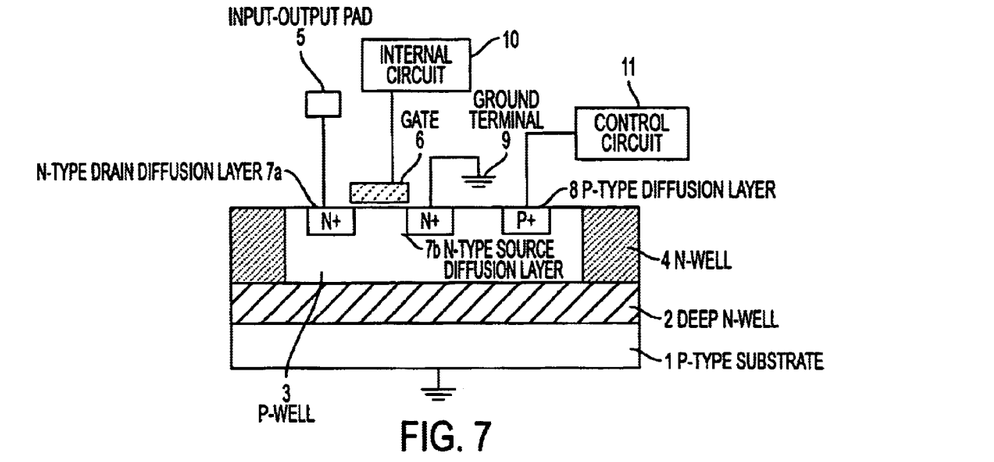
FIG. 7 is a cross sectional view showing an input-output protection device according to a first embodiment of this invention.
Figure 8:
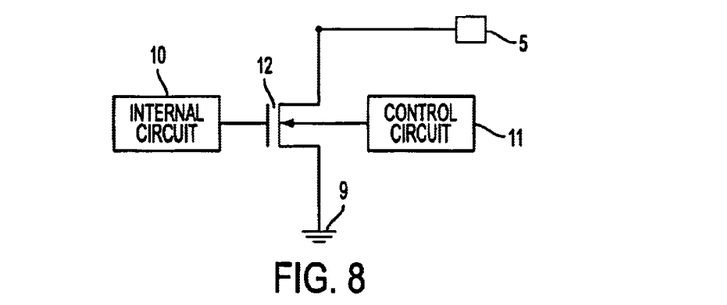
FIG. 8 is a circuit diagram of the protection device illustrated in FIG. 7.

Referring to FIGS. 7 and 8, description will be made about an input-output protection device of a semiconductor integrated circuit according to a first embodiment of this invention.

A nMOS protection device 12 is formed in a P-well 3 on a P-type substrate 1. Herein, the nMOS device 12 is composed of an N-type drain diffusion layer 7a, an N-type source diffusion layer 7b, and a gate 6.

The N-type drain 7a is connected to an input-output pad 5, the gate is connected to an internal circuit 10, and the N-type source diffusion layer 7b is connected to a ground terminal 9, respectively.

The gate 6 is connected to the internal circuit 10 because this embodiment is applied to an output buffer. In the meantime, when this embodiment is applied to an input buffer, the gate 6 may be connected to the ground terminal 9.

The P-well 3 is electrically isolated from the P-type substrate 1 by a deep N-well 2, and is connected to a control circuit 11 via a P-type diffusion layer 8 for controlling the voltage of the P-well 3.

When the integrated circuit is normally operated, the control circuit 11 produces 0V, so that the P-well is fixed to 0V.

Figure 9:
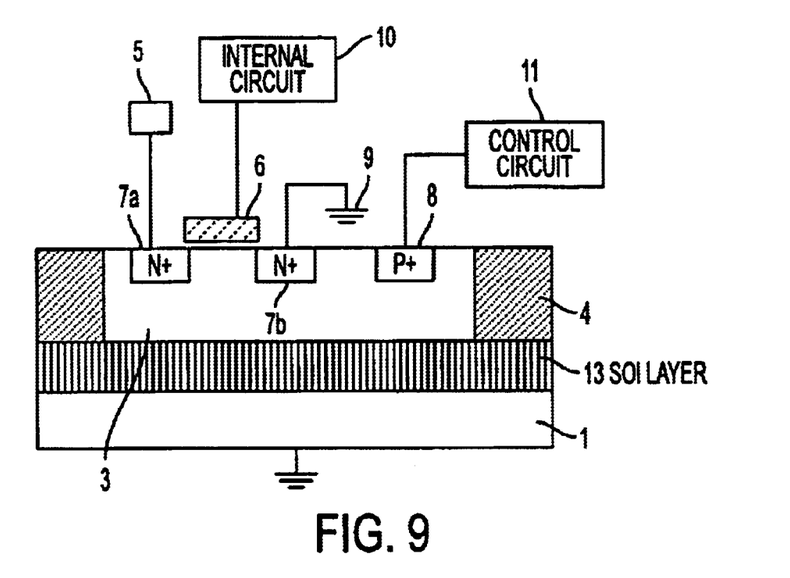
FIG. 9 is a cross sectional view showing an input-output protection device according to a second embodiment of this invention.

Referring to FIG. 9, description will be made about an input-output protection device of a semiconductor integrated circuit according to a second embodiment of this invention.

The second embodiment is substantially similar to the first embodiment except that the P-well 3 is electrically isolated from the P-type substrate 1 via an SOI (Silicon On Insulator) layer 13.

Subsequently, description will be made about the operation of the embodiments.

In FIG. 7, when a positive ESD-voltage is applied to the input-output pad 5 on the basis of the ground terminal 9, the current flows from the N-type drain diffusion layer 7a into the P-well 3.

However, the P-well 3 is electrically isolated from the P-type substrate by the deep N-well 2, and the P-well 3 is not grounded. Consequently, the potential of the P-well 3 easily rises up.

When the potential of the P-well 3 raises up, and a PN junction between the grounded N-type source diffusion layer 7b becomes a forward bias, a snapback takes place in the nMOS protection device 12.

Where the P-well 3 is electrically isolated from the P-type substrate 1, and is not directly connected to the ground terminal 9, the potential of the P-well 3 easily raises up, so that the snapback trigger voltage can be lowered.

When a negative polarity ESD-voltage is stressed to the input-output pad 5 on the basis of the ground terminal 9, the current flows from the N-type source diffusion layer 7b coupled to the ground terminal 9 into the P-well 3, the voltage of the P-well 3 rises up.

However, the potential of the P-well 3 easily raises up in the same manner when the positive polarity ESD-voltage is stressed, and thereby, the snapback trigger voltage is lowered.

The protection device can respond at lower voltage by lowering the snapback trigger voltage. Consequently, ESD robustness is improved.

Although the P-well 3 is electrically isolated from the P-type substrate 1 by the deep N-well in FIG. 7, the same result can be also obtained when the P-well is electrically isolated by the SOI layer 13, as illustrated in FIG. 9.

Further, the control circuit 11 is set so as to produce 0V during the normal operation. In this event, an off-leak is not increased because the P-well 3 is fixed to 0V.

Moreover, it is possible to lower the snapback trigger voltage regardless of the gate voltage in the embodiments.

In addition, ESD robustness does not depend upon the gate connection. Consequently, the embodiments are applicable to the output buffer and the input/output buffer other than the input buffer by changing connection of the gate.

FIRST EXAMPLE

Figure 10:
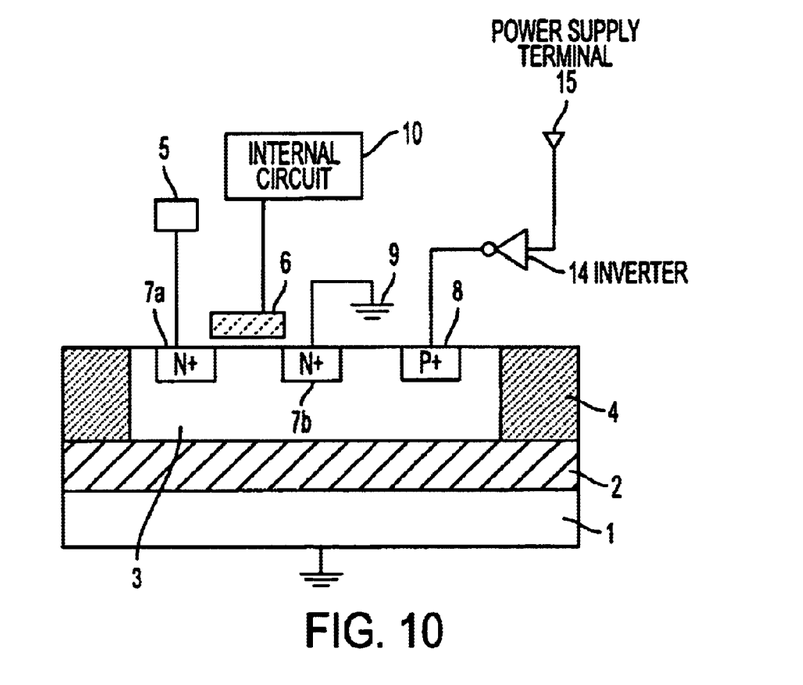
FIG. 10 is a cross sectional view showing an input-output protection device according to a first example of this invention.
Figure 11:
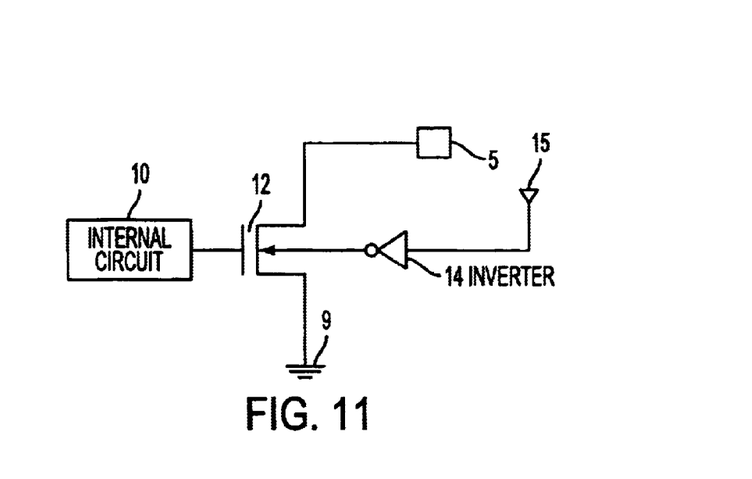
FIG. 11 is a circuit diagram of the protection device illustrated in FIG. 10.

Referring to FIGS. 10 and 11, description will be made about a first example of an input-output protection device of a semiconductor integrated circuit according to this invention.

An input-output protection device of an integrated circuit was formed on a semiconductor substrate 1. The input-output protection device had a MOS structure including a drain diffusion layer 7a, a gate 6, a source diffusion layer 7b, and a body 3 (namely, a P-well).

With such a structure, the drain diffusion layer 7a was connected to the input-output pad 5, the gate 6 was connected to an internal circuit 10 or a ground terminal 9, and the source diffusion layer 7b was connected to the ground terminal 9.

Further, the body 3 was electrically isolated from the semiconductor substrate 1, and was connected to the control circuit.

More specifically, the control circuit illustrated in FIG. 7 was replaced by an inverter 14 in the first example.

Phosphorus was injected into only the predetermined region of the P-type substrate 1 with a high energy. Thereby, after the deep N-well 2 was formed, the N-well 4 and the P-well 3 were formed with the depth shallower than the deep N-well 2. In this events the N-well 4 was formed so as to contact with the deep N-well 2.

The P-well 3 for forming the nMOS protection device was surrounded by the N-well 4 at side directions. Further, P-well 3 was electrically isolated from the P-type substrate 1 because the deep N-well 2 was placed under the P-well 3.

The nMOS protection device was formed in the P-well 3. Under this circumstance, the N-type drain diffusion layer 7a was connected to the input-output pad 5, the N-type source diffusion layer 7b was coupled to the ground terminal 9, and the gate was connected to the internal circuit 10, respectively.

Further, a p-type diffusion layer 8 for controlling the potential of the P-well was formed in the P-well 3. In this condition, an output terminal of the inverter 14 composed of nMOS and pMOS was connected to the P-type diffusion layer 8.

Herein, each of the nMOS and pMOS had a gate width of about 10 $\mu$m. Moreover, the input terminal of the inverter 14 was connected to a power supply terminal 15.

With such a structure, when the internal circuit 10 normally operated, 0V is applied to the P-well 3 via the inverter 14, and the P-well 3 is fixed to 0V.

On the other hand, when the internal circuit did not normally operate, 0V was not applied to the P-well 3, and the P-well 3 was put into in a floating state. In this state, ESD-voltage was stressed between the input-output pad 5 and the ground terminal 9, the potential of the P-well 3 rapidly raised up, and the snapback took places in the nMOS protection device.

When the P-well 3 was grounded, the snapback trigger voltage was equal to 7V. In contrast, the snapback voltage could be lowered to 5 V in this example.

SECOND EXAMPLE

Figure 12:
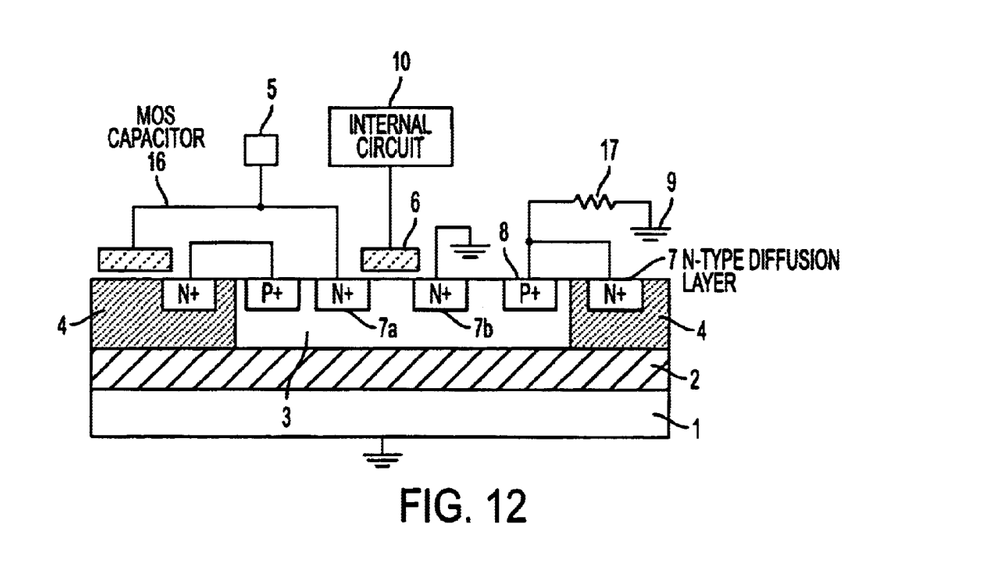
FIG. 12 is a cross sectional view showing a second example of this invention.
Figure 13:
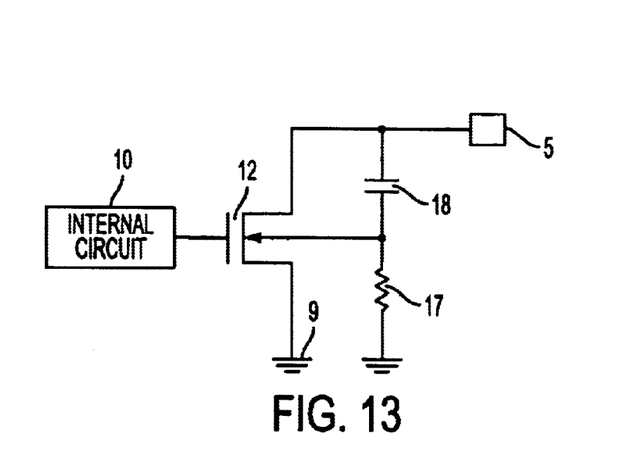
FIG. 13 is a circuit diagram of the protection device illustrated in FIG. 12.

Referring to FIGS. 12 and 13, description will be made about a second example of an input-output protection device of a semiconductor integrated circuit according to this invention.

In the second example, the control circuit was composed of a capacitor device 18 and a resistor device 17. The capacitor device 18 was composed of a MOS capacitor 16 which was formed by depositing the gate oxide film and the polysilicon on the N-well 4, as illustrated in FIG. 12. While, the resistor device 17 was formed by patterning a gate polysilicon with the desired size on a field oxide film.

Herein, the values of the capacitor device 18 and the resistor device 17 were selected such that a CR time constant was 10 nsec or higher considering a rising time of an ESD pulse of about 10 nsec into account. Specifically, the capacitance value was set to about 2 pF while the resistance value was set to about 7 k$\Omega$.

In the second example, the voltage of the P-well 3 more rapidly raised up by the coupling effect of the capacitor device 18 when the ESD was stressed thereto. Consequently, the snapback trigger voltage could be lowered to 4V.

THIRD EXAMPLE

Figure 14:
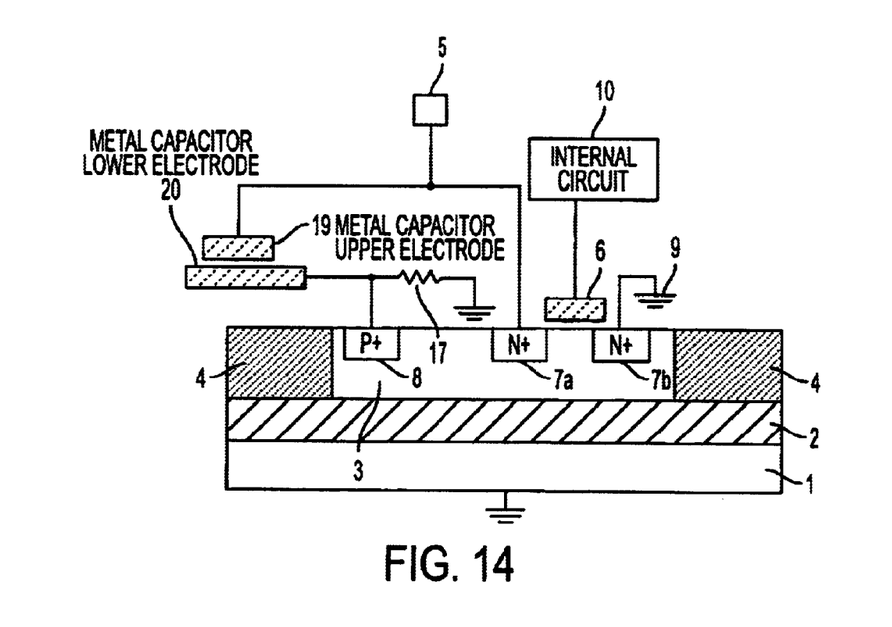
FIG. 14 is a cross sectional view showing a third example of this invention.

Referring to FIG. 14, description will be made about a third example of an input-output protection device of a semiconductor integrated circuit according to this invention.

In the third example, a metal capacitor, which was formed by sandwiching a capacitor insulating film between laminated conductors, was used as the capacitor device.

In this event, a metal capacitor upper electrode 19 and a metal capacitor lower electrode 20 were formed by tungsten silicide (WSix), respectively.

The resistor device 17 was formed by patterning the gate polysilicon on the field oxide film in the same manner as the second example.

In the third example, the snapback trigger voltage could be lowered to 4 V, as in the second example.

FOURTH EXAMPLE

Figure 15:
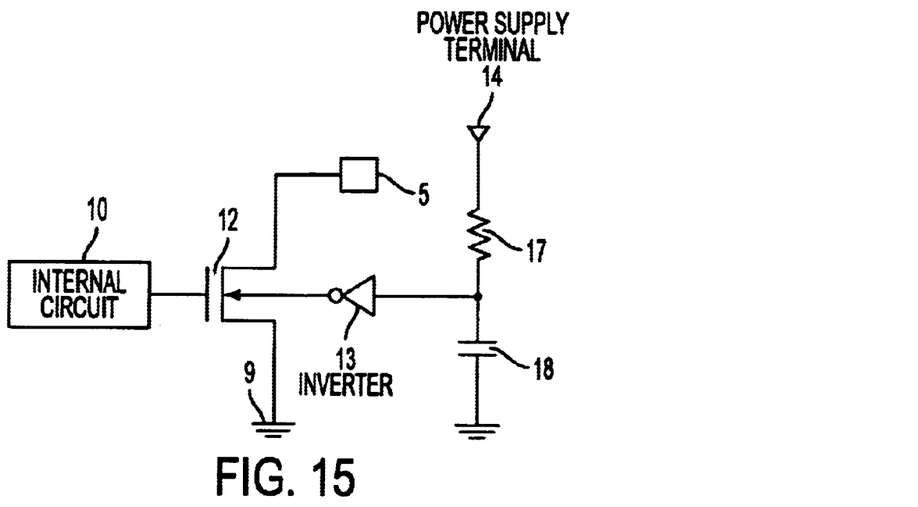
FIG. 15 is a circuit diagram showing a fourth example of this invention.

Referring to FIG. 15, description will be made about a fourth example of an input-output protection device of a semiconductor integrated circuit according to this invention.

In the fourth example, the inverter 13, the capacitor device 18, and the resistor device 17 were combined as the P-well control circuit of the nMOS protection device.

In the fourth example, the same effect as the first through third examples could be obtained or realized.

FIFTH EXAMPLE

Figure 16:
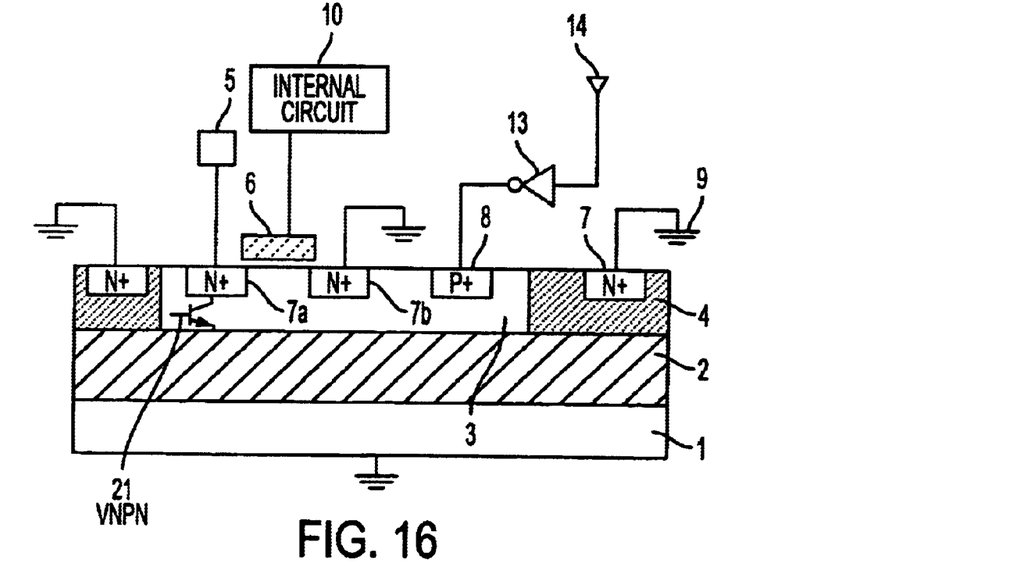
FIG. 16 is a cross sectional view showing a fifth example of this invention.

Referring to FIG. 16, description will be made about a fifth example of an input-output protection device of a semiconductor integrated circuit according to this invention.

In the fifth example, the P-well 3 of the nMOS protection device was controlled by the inverter 13 in the same manner as the first example. Under this circumstance, an N-type diffusion layer 7 was formed in the N-well 4, and was connected to the ground terminal 9.

In this case, the deep N-well 2 was formed by implanting ions with ion implanting energy of 900 keV in the first example. By contrast, the deep N-well 2 was formed with a shallow depth by the energy of 600 KeV in the fifth example.

Although phosphorous concentration was equal to $1\times10^{18}/cm^3$ in the first example, the phosphorous concentration was equal to $3\times10^{18}/cm^3$ in the fifth example, and was higher than the concentration of the first example.

When the ESD-voltage was stressed between the input-output pad 5 and the ground terminal 9, a lateral NPN bipolar transistor, which is composed of the N-type drain diffusion layer 7a, the P-well 3, and source diffusion layer 8, was turned on.

Further, the deep N-well 2 was made shallow in depth, and was higher in the impurity concentration, and was connected to the ground terminal 9. Thereby, the vertical NPN bipolar transistor (VNPN) 21, which was composed of the N-type drain diffusion layer 7a, the P-well 3, and the deep N-well 2, served to discharge the ESD-current. With such a structure, discharge ability per a unit size could be largely enhanced.

According to this invention, even when the diffusion layer serving as silicide has the shallow junction and the gate oxide film is thinned with reduction of an integrated circuit, the sufficient ESD robustness can be kept.

Further, the protection device according to this invention is composed of the MOS structure, which has the drain, the gate, the source, and the body.

With this structure, the body is electrically isolated from the semiconductor substrate in order to lower the snapback trigger voltage. Thereby, the ESD protection ability can be enhanced.

Therefore, the ESD robustness is independent of the connecting method of the gate. Consequently, the protection device is applicable as any one of an input buffer, an output buffer, and the input/output buffer by exchanging the connecting method of the gate via the wiring lines in the protection device having the same structure.

Moreover, in the case where the conventional NMOS device, in which both the gate and the body are coupled to the ground terminal, was applied in the CMOS semiconductor integrated circuit of 0.18μ rule having the gate oxide film thickness of about 40 Å, when Human Body Model (HBM) ESD test was carried out, the gate oxide film of the internal circuit was destroyed at 500 V or less.

By contrast, in this invention the ESD-voltage of 2000 V or more could be maintained when the input-output protection device was applied.

In addition, the output buffer could be structured with the protection device improved such that the gate voltage of the nMOS protection device raised up when the ESD was stressed thereto.

In comparison with this case, the equivalent ESD robustness could be kept with half size in this invention.

While this invention has thus far been disclosed in conjunction with several embodiments and examples thereof, it will be readily possible for those skilled in the art to put this invention into practice in various other manners.

What is claimed is:

1. An input-output protection device formed on a semiconductor substrate, comprising:
    a MOS protection device which has a drain diffusion layer, a gate, a source diffusion layer, and the MOS protection device being formed in a body;
    an input-output pad which is connected to the drain diffusion layer;
    an internal circuit which is connected to the gate;
    a control circuit which is connected to the body; and
    a first fixed voltage terminal which is connected to the source diffusion layer;
    the body being electrically isolated from the semiconductor substrate, and
    the body being not connected to the first fixed voltage terminal.

2. A device as claimed in claim 1, wherein:
    the control circuit is connected to the body via a diffusion layer.

3. A device as claimed in claim 1, wherein:
    the semiconductor substrate has a first conductive type,
    the body is structured by a well having a first conductive type, and
    the body is electrically isolated from the semiconductor substrate via an insulator,
    the insulator being formed between the well and the semiconductor substrate.

4. A device as claimed in claim 3, wherein:
    the first conductive type is a P-type while the insulator is an SOI layer.

5. A device as claimed in claim 1, wherein:
    the control circuit is an inverter having an input terminal and an output terminal,
    the input terminal is coupled to a second fixed voltage terminal, and
    the output terminal is connected to the body.

6. A device as claimed in claim 5, wherein:
    the output terminal is connected to the body via a diffusion layer.

7. A device as claimed in claim 1, wherein:
    the control circuit is composed of a capacitor device and a resistor device,
    the capacitor device is connected between the input-output pad and the body, and
    the resistor device is connected between the body and the first fixed voltage terminal.

8. A device as claimed in claim 1, wherein:
    the control circuit is composed of an inverter, a capacitor device and a resistor device, the inverter having an input terminal and an output terminal,
    the resistor device is connected between a second fixed voltage terminal and the input terminal,
    the capacitor device is connected between the input terminal and the first fixed voltage terminal, and
    the output terminal is connected to the body.

9. A device as claimed in claim 1, wherein:
    the control circuit serves to lower a snapback trigger voltage by increasing a potential of the body when a positive ESD-voltage is stressed to the input-output pad.

10. An input-output protection device formed on a semiconductor substrate comprising:
    a MOS protection device which has a drain diffusion layer, a gate, a source diffusion layer, and a body;
    an input-output pad which is connected to the drain diffusion layer;
    an internal circuit which is connected to the gate;
    a control circuit which is connected to the body; and
    a first fixed voltage terminal which is connected to the source diffusion layer;
    the body being electrically isolated from the semiconductor substrate wherein:
        the semiconductor substrate has a first conductive type,
        the body is structured by a first well having the first conductive type, and
        the body is electrically isolated from the semiconductor substrate via a second well having a second conductive type,
        the second conductive type being opposite to the first conductive type and being formed between the first well and the semiconductor substrate.

11. A device as claimed in claim 10, wherein:
    the first conductive type is a P-type while the second conductive type is an N-type.

12. A device as claimed in claim 10, wherein:
    the second well is connected to the first reference potential terminal.

13. An input-output protection device formed on a semiconductor substrate, comprising:
    a MOS protection device which has a drain diffusion layer, a gate, a source diffusion layer, and the MOS protection device being formed in a body;
    an input-output pad which is connected to the drain diffusion layer;
    a control circuit which is connected to the body; and
    a first fixed voltage terminal which is connected to the source diffusion layer and the gate;
    the body being electrically isolate from the semiconductor substrate, and
    the body being not connected to the first fixed voltage terminal.

* * * * *